(12) United States Patent
Hynes

(10) Patent No.: US 6,509,759 B1
(45) Date of Patent: Jan. 21, 2003

(54) MULTI POWER SUPPLY CIRCUIT PROTECTION APPARATUS AND METHOD

(75) Inventor: Owen J. Hynes, Otsego, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/073,541

(22) Filed: Feb. 11, 2002

(51) Int. Cl.[7] .......................................... H03K 19/0185
(52) U.S. Cl. .......................................... 326/81; 321/83
(58) Field of Search .............................. 326/80, 81, 82, 326/83, 86, 33

(56) References Cited

U.S. PATENT DOCUMENTS 5,767,697 A * 6/1998 Ueno et al. .................. 326/27
5,880,602 A * 3/1999 Kaminaga et al. ............ 326/58
6,346,829 B1 * 2/2002 Coddington .................. 326/68
6,351,157 B1 * 2/2002 Sharpe-Geisler ............. 326/81

* cited by examiner

Primary Examiner—Don Le
(74) Attorney, Agent, or Firm—Dennis C. Bremer

(57) ABSTRACT

A circuit is protected from the application voltage from a high and a low voltage source that may power up at different times by supplying a circuit the applies an intermediate voltage whenever the high voltage has powered up when the low voltage has not until such time as the low voltage has powered up.

20 Claims, 1 Drawing Sheet

MULTI POWER SUPPLY CIRCUIT PROTECTION APPARATUS AND METHOD

The Government may have certain rights in this patent in view of subcontract number 556849 between Honeywell and General Dynamics, such subcontract placed under U.S. Government prime contract number 00929009.

BACKGROUND OF THE INVENTION

1. Field of the Invention

The present invention relates to circuit protection and more particularly to protection of circuits when more than one power supply is used. Although not limited thereto, the present invention is an improvement on a previous co-pending application filed Sep. 17, 2001, Ser. No. 09/954,251 of Owen Hynes, et al., entitled "High Voltage CMOS Output Driver in Low Voltage Process," that is assigned to the Assignee of the present invention and is incorporated herein by reference.

2. Description of the Previous Invention

In the above-mentioned co-pending application, a circuit is described which utilizes two voltage sources to supply CMOS transistors in an output circuit that is operable to follow an input voltage at a higher level. More particularly, the invention described provides a high-voltage output buffer implemented in a low-voltage semiconductor process, enabling low-voltage semiconductors to interface with high voltage circuitry. The buffer uses a level translator that changes the input voltage (which, for example, may vary between Vss (for example, ground, or 0 volts), and the voltage of an intermediate source, Vdd, (for example, 3.3 volts), and converts it to an intermediate signal that varies between approximately a reference voltage, Vref, (for example about 1.66 volts), and a high voltage, Vdd2, (for example about 5 volts). The buffer also uses an output circuit that changes the intermediate signal to a final signal, which varies between Vss and Vdd2 (0 to 5 volts). In a preferred embodiment, a first power source, Vdd2, supplies the 5-volt signal, a second power source, Vdd, supplies the 3.3-volt signal. The reference voltage, Vref, is derived from the high voltage source so that they both power up at the same time with Vref being about ⅓ of Vdd2. The output circuit includes a first P type transistor having a first terminal connected to the high voltage source, Vdd2, (5 volts) and a second terminal connected to the first terminal of a second P type transistor. The second terminal of the second P type transistor is connected to the first terminal of a first N type transistor and to the final output line of the circuit. The second terminal of the first N type transistor is connected to the first terminal of a second N type transistor whose second terminal is connected to ground. Thus, the four transistors are connected in series between the high voltage source Vdd2 (5 volts) and ground. The first P type transistor has it gate connected to the Level Translator to receive a voltage which varies between Vref (1.66 volts) plus a threshold voltage to Vdd2 (5 volts). The second N type transistor has its gate connected to the Level Translator to receive an inverse of the Input to the Level Translator a signal which varies between ground and Vdd (3.3 volts)

To protect the transistors of the Output Circuit from receiving a voltage in excess of Vdd (3.3 volts) across their terminals, the second P type transistor has its gate connected to Vref (1.66V) and the first N type transistor has its gate terminal connected to Vdd (3.3 V). The Bias provided by the gate voltages (Vref and Vdd) prevents the full voltage, Vdd2 (5V) to Vss (ground or 0V) from being applied across any two terminals of any single transistor by ensuring that the high voltage drop is shared between the second P type transistor and the first N type transistor. A more complete explanation may be obtained from an examination of the above referred to co-pending application.

There is, however, a possible problem that may arise when the circuit is powered up or when Vdd has a power failure. If, for example, the 5-volt source, Vdd2, powers up first and is applied to the four series connected transistors before the 3.3-volt source, Vdd, powers up, an excessive voltage could be applied across a transistor in the output circuit causing damage thereto. Similarly, if Vdd were to drop to zero during a power failure while Vdd2 was still at a high voltage, an excessive voltage could be applied across a transistor in the output circuit.

It should be understood, that P-type and N-type CMOS transistors may be referred to as PMOS and NMOS transistors respectively herein. Also, CMOS transistors normally have "source," "drain," "gate" and "body" terminals. In PMOS transistors, the body terminal is usually tied to the "source" or "drain" whichever is higher while in NMOS transistors, the body terminal is usually tied to the "source" or "drain" terminal whichever is lower. Furthermore, the "source" and "drain" terminals may sometimes change names depending on the connection of the transistors in various configurations. In the present invention, use of "source" and "drain" to identify a particular terminal could become confusing and accordingly these two terminals will just be referred to as "first" and "second" terminals. Thus, the CMOS transistors (including both NMOS and PMOS) will just be recited as having first, second (which may be either drain or source) and gate terminals and the body terminal will be tied to one of the first or second terminals.

SUMMARY OF THE INVENTION

The present invention is an improvement on the above mentioned co-pending application by providing a protective circuit between Vref and the first N type transistor so as to apply the greater of Vdd or Vref to the gate of the first N type transistor in the output circuit. Thus, in the worst case situation, if Vdd is 0 volts, while Vref and Vdd2 are at their normal value (1.66 volts and 5 volts respectively) as, for example after Vref and Vdd2 have finished start-up and Vdd has just begun start up, or when Vdd fails, the gate of the first N type transistor is connected to Vref (1.66V) and the maximum voltage across the gate/1st terminal is 3.33 volts (5 volts–1.66 volts) while the voltage across the gate/2nd terminal is 1.66 volts (1.66 volts–0 volts). As Vdd2 increases, it passes the value of Vref and, and from then on, the Vdd voltage is applied to the gate of the first N type transistor and the voltage across the gate/1st terminal will decrease from 3.33 volts to 1.66 volts (5 volts–3.33 volts) while the voltage across the gate/2nd terminal will increase to 3.33 volts (3.33 volts–0 volts) when Vdd reaches its normal value. Thus in no event is the voltage across the gate/either terminal ever greater than 3.33 volts.

DETAILED DESCRIPTION OF THE PREFERRED EMBODIMENTS

Figure 1:
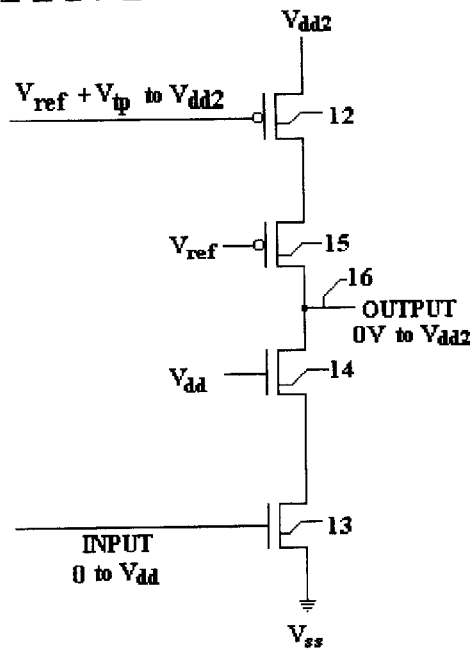
FIG. 1 shows the output stage of the buffer of the above-mentioned co-pending application.
Figure 2:
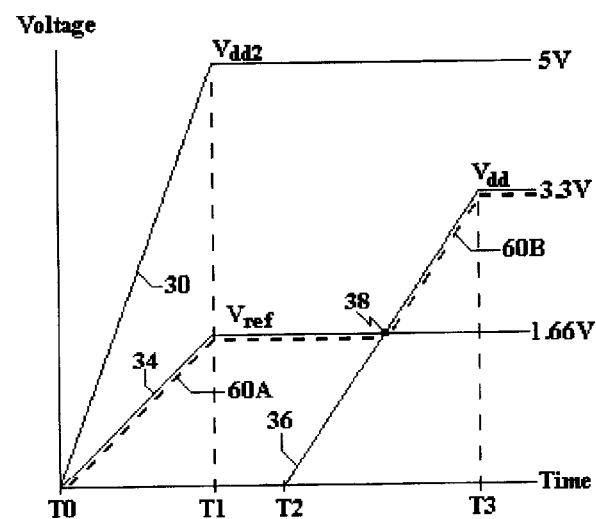
FIG. 2 is a graph showing how the power sources Vdd and Vdd2 may power dup at different times.

FIG. 1 is a schematic representation of the output circuit taken from FIG. 2 of the above referred to application. For purposes of simplifying comparison with the present application, the reference numerals in FIG. 2 of the prior case have been retained but have been reduced by 200

FIG. 1, which is basically the same as the output circuit of the above mentioned co-pending application, shows four transistors 12, 13, 14 and 15, connected in series between a source of high voltage, Vdd2, (say 5 volts) and a source of low voltage, Vss (say zero volts, or ground). Transistor 12 is a PMOS transistor receiving a signal on its gate, which varies between a low intermediate voltage, Vref (say 1.66V) plus the PMOS threshold voltage, Vtp (say about 0.85V) to Vdd2 as in the above identified co-pending application. Transistor 13 is an NMOS transistor shown receiving a signal on its gate, which varies between Vss and a high intermediate voltage, Vdd (say 3.3V) as in the above-identified co-pending application. A first terminal of NMOS transistor 13 is connected to Vss and a second terminal of transistor 13 is connected to a first terminal of an NMOS transistor 14 whose gate is connected to Vdd and whose second terminal is connected to an output terminal 16, intended to produces a signal that varies between Vss and Vdd2. Transistor 15 is a PMOS transistor with its gate connected to Vref, its first terminal connected to the output 16 and its second terminal connected to the first terminal of PMOS transistor 12 whose second terminal is connected to Vdd2. Although not shown, the body connections of the PMOS transistors are connected to the first or second terminal which ever is at a higher voltage and the body connections for the NMOS transistors are connected to the first or second terminals which ever is at a lower voltage. As will be clear from an examination of the above referred to application, under normal operation, no single transistor is subject to a voltage of greater than 3.3V between any two of its terminals.

However, when the system just begins to operate, i.e., under a condition of "power-up," Vdd2 and Vdd may start at different times and thus, Vdd2 may increase to its full potential before Vdd has increased significantly. Under these conditions, it is possible for large voltage (i.e., in excess of 3.3V) to be applied across the gate and the first and second terminals of transistor 14. This situation can be seen from the graph in FIG. 2.

FIG. 2 is an approximation of the start or "power up" situation and shows a plot of Voltage vs. Time. It is seen that Vdd2 begins to power up at time T0 and increases along line 30 to reach its full potential (5V) and a time T1. Vref, which is derived from Vdd2, also begins power up at time T0, or closely thereafter, and increases along line 34 until it reaches its full potential (1.66V) also at approximately time T1. Vdd is shown beginning to power up at time T2, which is subsequent to T0 and is shown, for example, to be shortly after T1 although it could be shortly before T1. In any event, Vdd is shown increasing along a line 36 crossing line 34 at a junction point 38 and then proceeding until it reaches its full potential (3.3 V) at a time T3. Now, since Vdd is still low or 0 when Vdd2 is fully powered, then, because PMOS transistors 12 and 15 are "on" there may be a full 5 volts between the gate and top terminals of NMOS transistor 14. This voltage could cause damage to transistor 14 and the present invention operates to prevent this situation as will be seen in FIG. 3.

Figure 3:
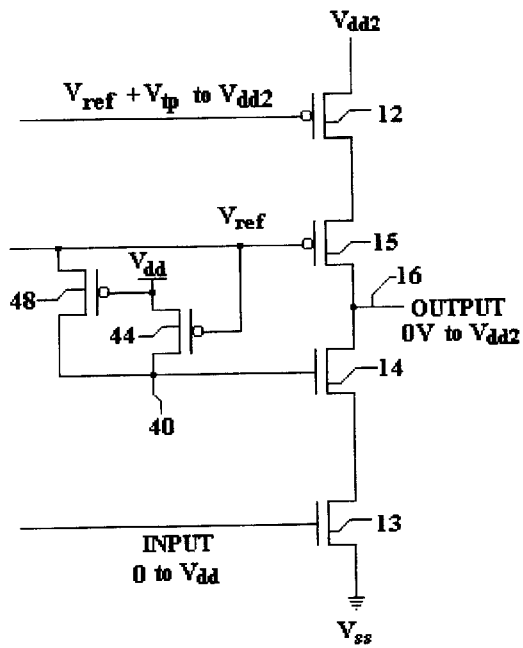
FIG. 3 is a schematic diagram of a preferred embodiment of the present invention.

In FIG. 3, the chain of transistors 12, 13, 14 and 15 is the same as in FIG. 1 with the same reference numerals. In FIG. 3, however, the gate of NMOS transistor 14 is not connected to Vdd directly but rather is connected to a junction point 40. A PMOS transistor 44 has its terminals connected between Vdd and junction point 40 and has its gate connected to Vref.

Another PMOS transistor 48 has its terminals connected between Vref and junction point 40 and has its gate connected to Vdd. Although not shown, the body connections of both transistor 44 and transistor 48 are tied to the junction point 40 since it will always be the higher of the voltages on the terminals of the transistors. Now, if Vdd is low or 0 volts, (for example during start-up like in FIG. 2), while Vdd2 is increasing to its high or 5V, Vref is also increasing to its high or 1.66V. Under these conditions, transistor 48 is "on" (since its gate at Vdd is lower than its first terminal at Vref) while, transistor 44 is "off" (since its gate at Vref is higher than its first terminal at Vdd). Accordingly, the voltage applied to junction point 40 will follow Vref (through the "on" transistor 48 from its first terminal to its second terminal). This is seen in FIG. 2 as the dashed line 60A, which represents the voltage at junction point 40 of FIG. 3, increasing from a low value (0V) to the final value of Vref (1.66V).

At time T2, Vdd starts increasing along line 36 but transistor 48 remains "on" and transistor 44 remains "off" so the voltage at junction point 40 continues to follow dashed line 60A. This will continue until Vdd increases to a point just below Vref by a threshold value (about 0.85 V) at which time transistor 48 shuts "off" (since its gate at Vdd is no longer lower than its first terminal at Vref). When the voltage Vdd has increased to a point just above Vref by a threshold voltage (0.85 volts) transistor 44 in FIG. 3 will turn "on" (since its gate at Vref is no longer higher than its first terminal at Vdd) and now the voltage applied to junction point 40 will follow Vdd (through the "on" transistor 44 from its first terminal to its second terminal). This is shown in FIG. 2 as dashed line 60B which continues from the end of dashed line 60A at point 38, up to the full voltage of Vdd (3.3 volts) Thus, transistor 14 is protected since it will always have either Vref (up to 1.66 volts) or Vdd (up to 3.3 volts) applied to its gate during power up.

It is therefore seen that I have provided a protection circuit for transistor 14 during a power up situation. It should be understood, however, that the present invention is not limited to use with a high voltage CMOS output driver in low voltage process as described in connection with the preferred embodiment. Indeed, the invention may be used in any application where two or more power sources are connected to a circuit and where it is desired that the higher voltage not be applied to certain components before the lower voltage is applied. For example, a level shifter circuit or a high voltage tolerant input-output circuit. It should also be understood that use of CMOS transistors in describing the present invention is not intended to be limiting and that other electronic switching devices may also be used. Of course, the specific voltages used were just examples and other magnitudes could obviously be employed.

Accordingly, I do not wish to be limited to the specific showing used in connection with the description of the preferred embodiment. It is intended that the invention be only limited by the claims and the full scope and equivalents thereof.

What is claimed is:

1. A circuit including a source of first voltage that may vary between a first value and a second value, and a source of second voltage that may vary between the first value and a third value, and a junction point, the junction point being connected to that one of the first and second voltage sources which has the greater value, comprising:

a first electronic switching device having a first terminal connected to the junction point, a second terminal connected to the second voltage source and a third terminal connected to the first voltage source;

a second electronic switching device having a first terminal connected to the junction point, a second terminal connected the first voltage source and a third terminal connected to the second voltage source, the first and second electronic switching devices operating so that whenever the first voltage source is greater than the second voltage source, the second electronic switching device is turned "off" and the first electronic switching device is turned "on" to connect the first voltage source to the junction point and whenever the second voltage source is greater than the first voltage source, the first electronic switching device is turned "off" and the second electronic switching device is turned "on" to connect the second voltage source to the junction point.

2. Apparatus according to claim 1 wherein the first and second electronic switching devices are CMOS transistors, the third terminals of which are gate terminals.

3. Apparatus according to claim 2 further including a third CMOS transistor having first, second and gate terminals and wherein the first terminal of the third transistor is connected to a source of third voltage, the second terminal of the third transistor is connected to a source of fourth voltage and the gate terminal of the third transistor is connected to the junction point, the first and second transistors operating to prevent a damaging voltage from being applied to the third transistor by assuring that the gate terminal of the third transistor receives the higher of the first and second voltages.

4. Apparatus according to claim 3 further including a fourth CMOS transistor having first, second and gate terminals and wherein the first terminal of the fourth transistor is connected to the second terminal of the third transistor, the second terminal of the fourth transistor is connected to the source of fourth voltage and the gate terminal of the fourth transistor is connected to the source of first voltage.

5. Apparatus according to claim 4 further including fifth CMOS transistors having first, second and gate terminals and a sixth CMOS transistor having first, second and gate terminals, the fifth transistor having its first terminal connected to the source of third voltage and its second terminal connected to the first terminal of the third transistor, the sixth transistor having a first terminal connected to the second terminal of the fourth transistor and its second terminal connected to the source of fourth voltage.

6. Apparatus according to claim 5 wherein the voltage from the first voltage source is normally between the voltage from the third voltage source and the voltage from the fourth voltage source and the voltage from the second voltage source is normally between the voltage from the first voltage source and the voltage from the fourth voltage source.

7. Apparatus according to claim 6 wherein the first, second, fourth and sixth transistors are PMOS transistors and the third and fifth transistors are NMOS transistors.

8. Apparatus according to claim 3 wherein, upon start-up, the first and fourth voltages increase from the third voltage at a time proximate T0 to their respective normal voltages at a time proximate T1 and the second voltage increases from the third voltage at a time T2, subsequent to T0, to its normal voltage at a time T3, and the first and second transistors assure that the gate of the third transistor receives the higher of the first and third voltages between time T0 and time T3.

9. Apparatus according to claim 7 wherein, upon start-up, the first and fourth voltages increase from the third voltage at a time proximate T0 to their respective normal voltages at a time proximate T1 and the second voltage increases from the third voltage at a time T2, subsequent to T0, to its normal voltage at a time T3, and the first and second transistors assure that the gate of the third transistor receives the higher of the first and third voltages between time T0 and time T3.

10. In a circuit having a first CMOS transistor with first, second and gate terminals, the first terminal of the first transistor connected to a first voltage, the gate terminal of the first transistor connected to a second voltage, the circuit having a second CMOS transistor with first, second and gate terminals, the second terminal of the second transistor connected to the first terminal of the first transistor and the first terminal of the second transistor connected to a third voltage, an excessive voltage protection circuit comprising:

a third CMOS transistor having first, second and gate terminals, the first terminal of the third transistor connected to the gate of the second transistor, the second terminal of the third transistor connected to a fourth voltage and the gate terminal of the third transistor connected to the second voltage;

a fourth CMOS transistor having first, second and gate terminals, the first terminal of the fourth transistor connected to the gate terminal of the second transistor, the second terminal of the fourth transistor connected to the second voltage and the gate terminal of the fourth transistor connected to the fourth voltage, the first voltage being normally larger than the fourth voltage, the fourth voltage being normally larger than the second voltage and the second voltage being normally larger than the third voltage.

11. Apparatus according to claim 10 further including:

a fifth CMOS transistor having first, second and gate terminals with the first terminal of the fifth transistor connected to the second terminal of the first transistor and the second terminal of the fifth transistor connected to the first voltage; and, a sixth CMOS transistor having first, second and gate terminals with the first terminal of the sixth transistor connected to the third voltage and the second terminal of the sixth transistor connected to the first terminal of the second transistor.

12. Apparatus according to claim 11 wherein the first, third, fourth and fifth transistors are PMOS transistors and the second and sixth transistors are NMOS transistors.

13. Apparatus according to claim 12 wherein, upon start-up, the first voltage increases from the third voltage to the first voltage during a time T0 to T1, the second voltage increases from the third voltage to the second voltage during substantially the same time T0 to T1, the third voltage does not change and the fourth voltage changes from the third voltage to the fourth voltage during a time T2 to T3 where T2 is subsequent to T0, the third and forth transistors operating to apply the higher of the second or fourth voltages to the gate of the second transistor to prevent excessive voltage thereto.

14. Apparatus according to claim 13 further including an output terminal connected to the second terminal of the second transistor, whereby, the voltage on the output terminal may vary between the first voltage and the third voltage.

15. In a circuit having a source of first voltage, a source of second voltage, the second voltage being smaller than the first voltage, a source of third voltage, the third voltage being smaller than the second voltage and a source of fourth voltage, the fourth voltage being smaller than the third voltage, the circuit also using first, second, third and fourth output CMOS transistors, each having first, second and gate terminals and being connected in series with the first terminal of the first transistor connected to the source of fourth voltage, the first terminal of the second transistor connected to the second terminal of the first transistor, the first terminal of the third transistor connected to the second terminal of the second transistor, the first terminal of the fourth transistor connected to the second terminal of the third transistor and the second terminal of the fourth transistor connected to the source of first voltage, the circuit also having an output terminal connected to the second terminal of the second transistor, the circuit receiving a first input signal at the gate of the first transistor which signal varies between the fourth voltage and the second voltage and receiving a second input signal at the gate of the fourth transistor which signal varies between a voltage above the third voltage and the first voltage, the circuit operable to produce an output signal on the output terminal which varies between the fourth voltage and the first voltage, the improvement comprising:

fifth and sixth CMOS transistors each having first, second and gate terminals;

means connecting the first terminal of the fifth transistor and the first terminal of the sixth transistors to the gate of the second transistor;

means connecting the gate of the third transistor, the gate of the fifth transistor and the second terminal of the sixth transistor to the source of third voltage; and means connecting the second terminal of the fifth transistor and the gate of the sixth transistor to the source of second voltage.

16. The circuit of claim 15 wherein the first and second transistors are NMOS transistors and the third, fourth, fifth and sixth transistors are PMOS transistors.

17. The circuit of claim 16 wherein the first voltage is high, the fourth voltage is low, the second voltage is proximate one third the high voltage and the fourth voltage is proximate two thirds the high voltage.

18. The method of protecting a CMOS transistor having a first terminal which may be connected to a high voltage and a second terminal which may be connected to a low voltage and a gate terminal which would normally be connected to receive a desired voltage but which may receive a voltage between the low voltage and the desired voltage during start up thus producing an excessive gate to first terminal voltage, comprising;

A. providing a source of reference voltage which is of a value that would not produce excessive gate to first terminal voltage; and, B. connecting the gate terminal of the transistor to the source of reference voltage or the source of desired voltage which ever is higher.

19. The method of claim 18 wherein the reference voltage is proximate one third of the high voltage and the desired voltage is proximate two thirds of the high voltage.

20. The method of claim 19 wherein step B includes:

B1. detecting the higher of the voltages of the source of reference voltage and the source of desired voltage; and B2. switching from the source of reference voltage to the source of desired voltage when the source of reference voltage becomes lower than the source of desired voltage.

* * * * *

UNITED STATES PATENT AND TRADEMARK OFFICE
CERTIFICATE OF CORRECTION

PATENT NO.     : 6,509,759 B1
DATED          : January 21, 2003
INVENTOR(S)    : O. J. Hynes It is certified that error appears in the above-identified patent and that said Letters Patent is hereby corrected as shown below:

Column 5,
Line 7, delete "second" (second occurrence) and substitute -- first --.
Line 8, delete "first" and substitute -- second --.
Line 11, delete "first" (second occurrence) and substitute -- second --.
Line 13, delete "second" and substitute -- first --.
Line 35, delete "fifth" insert -- a --.
Line 36, change "transistors" to -- transistor --.
Line 59, change "third" to -- second --.
Line 68, change "third" to -- second --.

Column 6,
Line 2, change "first" (first occurrence) to -- second --.

Column 7,
Line 30, change "second" to -- third --.

Column 8,
Line 1, change "fourth" to -- second --.

Signed and Sealed this

Twenty-fifth Day of May, 2004

JON W. DUDAS
*Acting Director of the United States Patent and Trademark Office*